(12) United States Patent
Sabert et al.

(10) Patent No.: US 11,467,339 B2
(45) Date of Patent: Oct. 11, 2022

(54) RADIATION SOURCE AND A METHOD FOR USE IN METROLOGY APPLICATIONS

(71) Applicant: ASML NETHERLANDS B.V., Veldhoven (NL)

(72) Inventors: Hendrik Sabert, London (GB); Patrick Sebastian Uebel, Marloffstein (DE)

(73) Assignee: ASML Netherlands B.V., Veldhoven (NL)

( * ) Notice: Subject to any disclaimer, the term of this patent is extended or adjusted under 35 U.S.C. 154(b) by 86 days.

(21) Appl. No.: 17/190,474

(22) Filed: Mar. 3, 2021

(65) Prior Publication Data

US 2021/0199885 A1 Jul. 1, 2021

Related U.S. Application Data

(63) Continuation of application No. 16/925,586, filed on Jul. 10, 2020, now Pat. No. 10,969,542.

(30) Foreign Application Priority Data

Jul. 19, 2019 (EP) .................................... 19187242

(51) Int. Cl.
*G02B 6/02* (2006.01)
*G01K 11/3206* (2021.01)

(52) U.S. Cl.
CPC ...... *G02B 6/02328* (2013.01); *G01K 11/3206* (2013.01); *G02B 6/0239* (2013.01)

(58) Field of Classification Search
None
See application file for complete search history.

(56) References Cited

U.S. PATENT DOCUMENTS

| | | | |
|---|---|---|---|
| 6,961,116 B2 | 11/2005 | Den Boef et al. |
| 7,110,646 B2 | 9/2006 | Eggleton et al. |
| 2003/0169987 A1 | 9/2003 | Eggleton et al. |
| 2005/0111804 A1 | 5/2005 | Bjarklev et al. |
| 2009/0195768 A1 | 8/2009 | Bijnen et al. |
| 2010/0328655 A1 | 12/2010 | Den Boef |
| 2011/0026032 A1 | 2/2011 | Den Boef et al. |

(Continued)

FOREIGN PATENT DOCUMENTS

| | | |
|---|---|---|
| CN | 103022880 | 4/2013 |
| CN | 106405727 | 2/2017 |

(Continued)

OTHER PUBLICATIONS

European Search Report issued in corresponding European Patent Application No. 1918724.3, dated Apr. 8, 2020.

(Continued)

*Primary Examiner* — Andrew Jordan
(74) *Attorney, Agent, or Firm* — Pillsbury Winthrop Shaw Pittman LLP

(57) ABSTRACT

A system and method for providing a radiation source. In one arrangement, the radiation source includes an optical fiber that is hollow, and has an axial direction, a gas that fills the hollow of the optical fiber, and a plurality of temperature setting devices disposed at respective positions along the axial direction of the optical fiber, wherein the temperature setting devices are configured to control the temperature of the gas to locally control the density of the gas.

20 Claims, 6 Drawing Sheets

(56) References Cited

U.S. PATENT DOCUMENTS

| | | | |
|---|---|---|---|
| 2011/0102753 A1 | 5/2011 | Van De Kerkhof et al. | |
| 2011/0247369 A1 | 10/2011 | Milicevic et al. | |
| 2011/0249244 A1 | 10/2011 | Leewis et al. | |
| 2012/0044470 A1 | 2/2012 | Smilde et al. | |
| 2014/0334763 A1 | 11/2014 | Holzer et al. | |
| 2015/0261097 A1 | 9/2015 | Mathijssen et al. | |
| 2016/0161863 A1 | 6/2016 | Den Boef et al. | |
| 2016/0370717 A1 | 12/2016 | Den Boef et al. | |
| 2021/0199885 A1* | 7/2021 | Sabert | G03F 7/70025 |

FOREIGN PATENT DOCUMENTS

| | | |
|---|---|---|
| EP | 1628164 | 2/2006 |
| EP | 2942847 | 11/2015 |

OTHER PUBLICATIONS

Song, Zhenming et al.: "Femtosecond pulse propagation in temperature controlled gas-filled hollow fiber", Optics Communication, vol. 281, No. 15-16, Aug. 1, 2008, pp. 4109-4113.

Song, Zhen-ming et al.: "Simulation of Femtosecond Pulse Propagation through Hollow Fiber Filled with Noble Gases of Gradient Temperature", Chinese Physics Letters, Institute of Physics Publishing, vol. 25, No. 1, Jan. 1, 2008, pp. 129-132.

International Search Report and Written Opinion issued in corresponding PCT Patent Application No. PCT/EP2020/069007, dated Sep. 4, 2020.

* cited by examiner

RADIATION SOURCE AND A METHOD FOR USE IN METROLOGY APPLICATIONS

This application is a continuation of U.S. patent application Ser. No. 16/925,586, filed Jul. 10, 2020, now allowed, which claims the benefit of priority of European patent application no. 19187242.3, filed Jul. 19, 2019, each of the foregoing applications is incorporated herein in its entirety.

FIELD

The present description relates to a radiation source and a method for operating the radiation source, in particular, a radiation source for use in a lithographic apparatus or metrology tools.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

SUMMARY

A metrology apparatus can be used to measure parameters of interest of structures on the substrate. For example, a metrology apparatus can be used to measure parameters such as critical dimension, overlay between layers on the substrate and asymmetry of a pattern on the substrate. Rays of measurement radiation (such as one or more of the wavelengths of radiation describe above) are used to illuminate the substrate. The radiation is diffracted by the structure on the substrate. The diffracted radiation is collected by an objective lens and captured by a sensor.

The rays of measurement radiation are provided by radiation emitted by a radiation source. This radiation is directed onto the substrate via a beam splitter and the objective lens that collects the diffracted radiation from the substrate.

It is desirable, for example, to provide a radiation source that has a controllable output. In particular, it is desirable to provide a radiation source that, for example, has a given spectrum, or a controllably-stable spectrum.

According to an aspect, there is provided a radiation source, comprising: an optical fiber that is hollow, and has an axial direction; a gas that fills the hollow of the optical fiber; and a plurality of temperature setting devices disposed at respective positions along the axial direction of the optical fiber, wherein the temperature setting devices are configured to control the temperature of the gas to locally control the density of the gas.

According to an aspect, there is provided a method for operating a radiation source comprising a gas-filled optical fiber, the method comprising controlling the temperature of the gas at a plurality of positions along the axial direction of the optical fiber, such that the density of the gas is locally controlled at each position.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
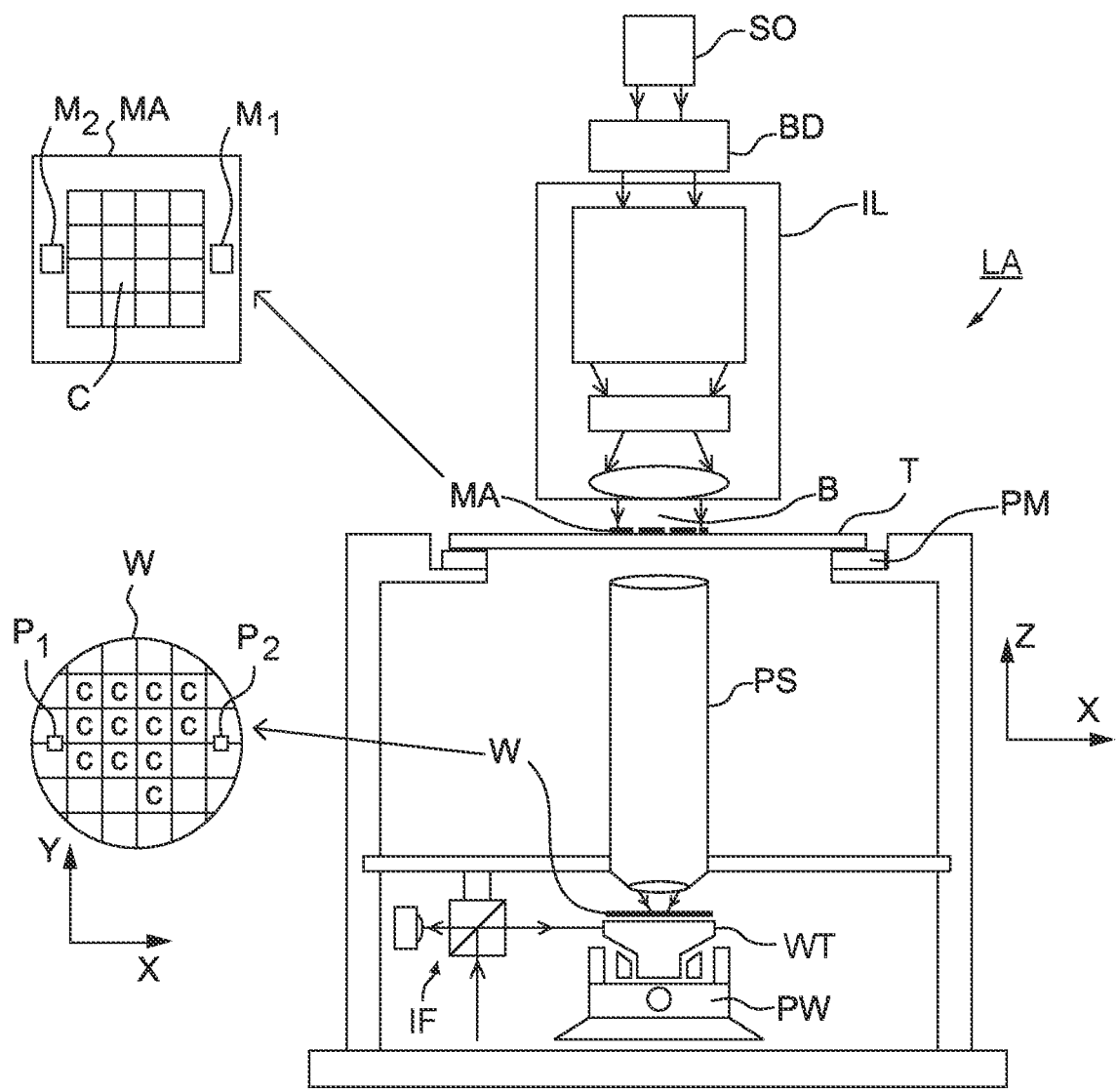
FIG. 1 depicts a schematic overview of lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a patterning device support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the patterning device support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
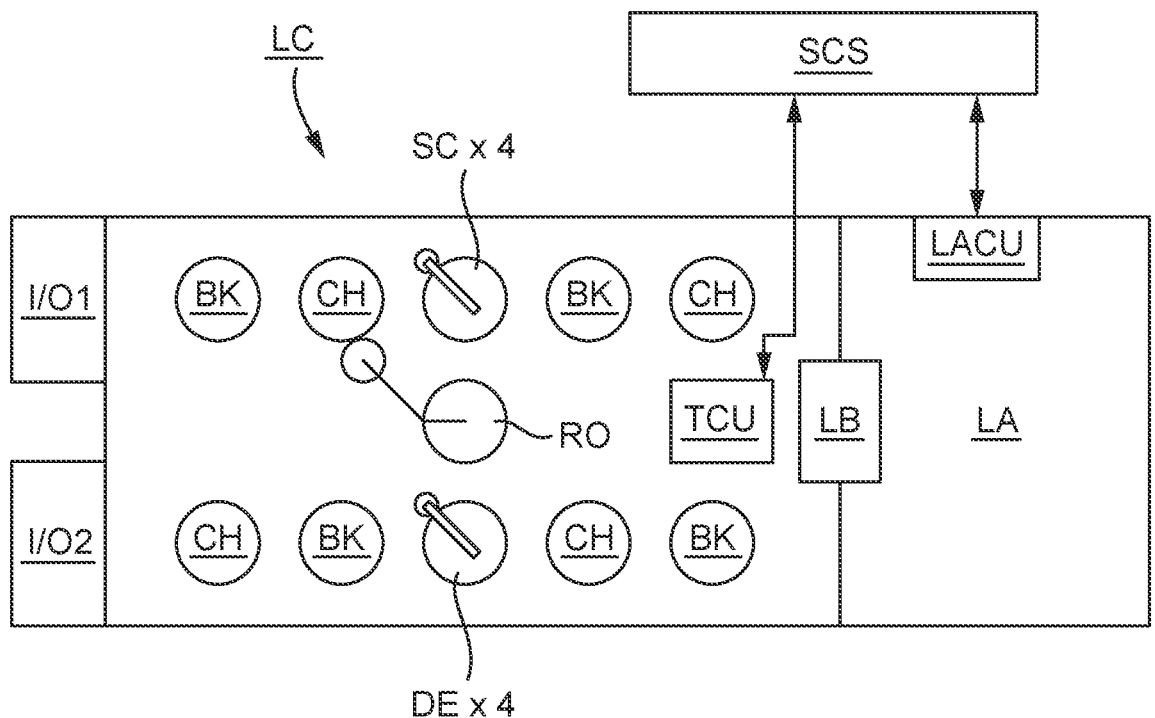
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
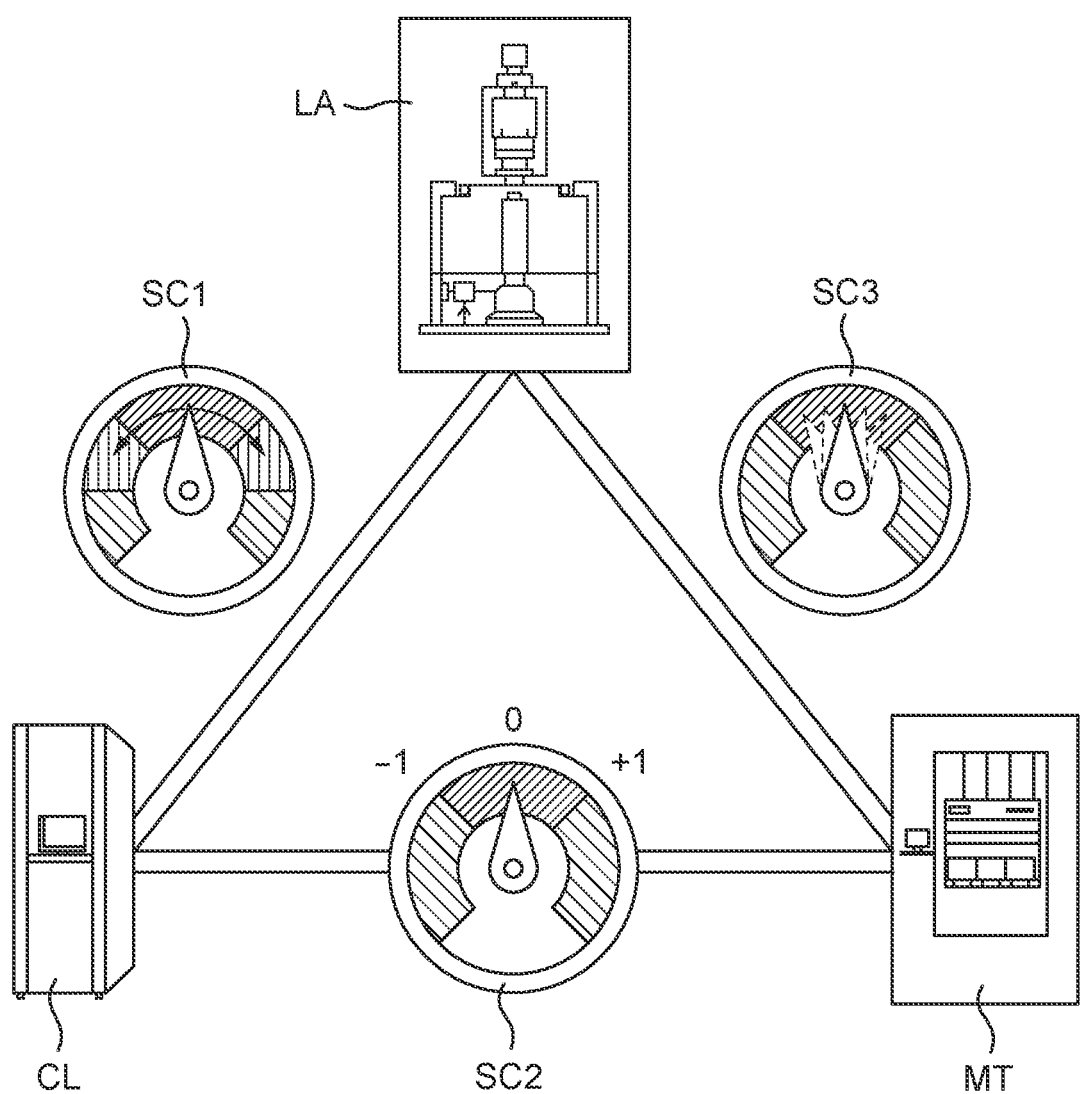
FIG. 3 depicts a schematic representation of holistic lithography, representing a cooperation between three technologies to optimize semiconductor manufacturing.

Typically the patterning process in a lithographic apparatus LA is one of the most critical steps in the processing which requires high accuracy of dimensioning and placement of structures on the substrate W. To help ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). A desire of such a "holistic" environment is to optimize the cooperation between these three systems to enhance the overall process window and provide tight control loops to help ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the one or more process parameters in the lithographic process or patterning process are allowed to vary.

The computer system CL may use (part of) the design layout to be patterned to predict which one or more resolution enhancement techniques to use and to perform computational lithography simulations and calculations to determine which patterning device (mask) layout and lithographic apparatus settings achieve the largest overall process window of the patterning process (depicted in FIG. 3 by the double arrow in the first scale SC1). Typically, the one or more resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to frequently make measurements of the structures created, e.g., for process control and verification. Different types of metrology apparatus MT for making such measurements are known, including scanning electron microscopes or various forms of scatterometer metrology apparatus MT.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. patent application publication nos. US20100328655, US2011102753A1, US20120044470A, US20110249244, and US20110026032 and European patent application publication no. EP1,628,164, each of the foregoing patent application publications incorporated herein in its entirety by reference. Aforementioned scatterometers may measure gratings using radiation from an embodiment of a radiation source described herein.

Overall measurement quality of a lithographic parameter using a specific target is at least partially determined by a measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. patent application publication no. US2016-0161863 and U.S. patent application publication no. US 2016/0370717, each incorporated herein its entirety by reference. An embodiment of the radiation source described herein may be configured to be controllable in respect to the radiation requirements of these substrate measurement recipes.

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor is based on a self-referencing interferometer as described in U.S. Pat. No. 6,961,116, which is incorporated herein in its entirety by reference. Various enhancements and modifications of the sensor have been developed, for example as disclosed in U.S. patent application publication no. US2015261097A1, which is incorporated herein in its entirety by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in U.S. patent application publication no. US2009/195768A, which is incorporated herein in its entirety by reference.

The alignment sensor scans each mark optically with a spot of radiation to obtain a periodically varying signal, such as a sine wave. The phase of this signal is analyzed to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, clamping (electrostatic and/or vacuum) of the substrate to the substrate table and/or heating of the substrate when the substrate is exposed to radiation.

Figure 4A:
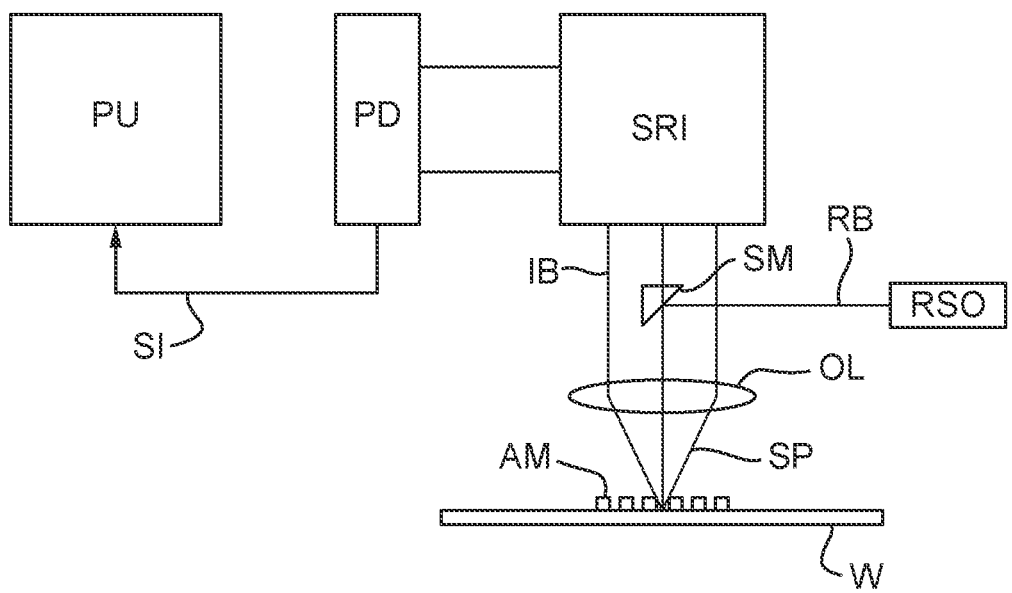
FIGS. 4A and 4B depict a schematic block diagram of an alignment sensor, and a level sensor respectively.

FIG. 4A is a schematic block diagram of an embodiment of an alignment sensor AS, such as is described, for example, in U.S. Pat. No. 6,961,116, which is incorporated herein in its entirety by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The radiation source RSO may be provided by an embodiment of the radiation source described herein. The illumination spot SP, by which the mark AM is illuminated, may be slightly smaller in width (e.g. diameter) than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array. The photodetector PD can provide a signal SI to processing unit PU, which can then determine one or more properties of the mark AM from the signal SI.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 4B:
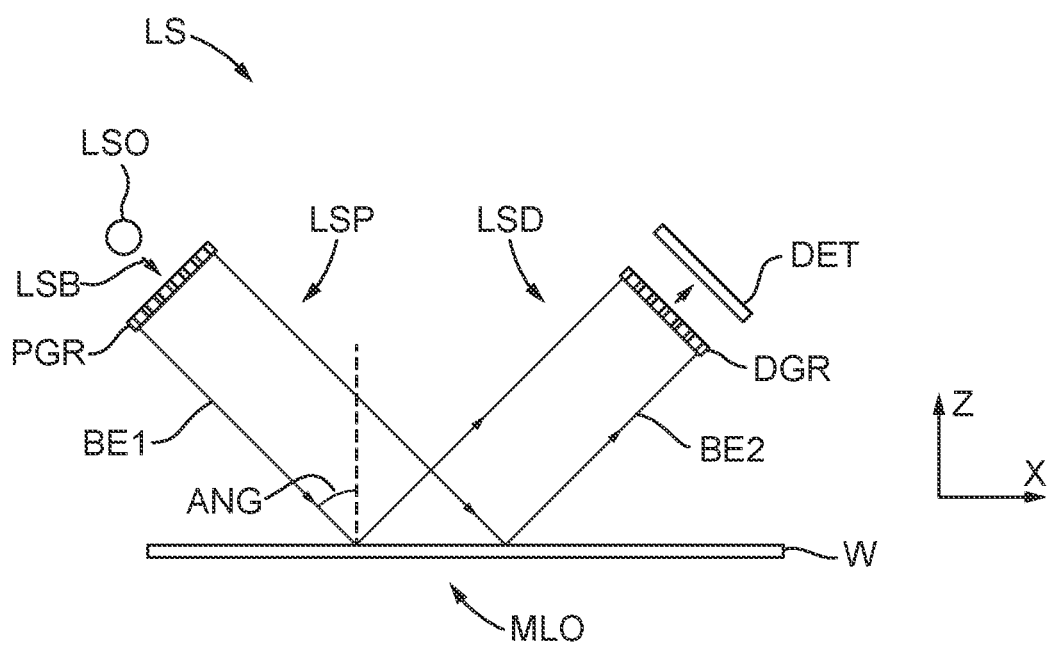

An example of a level or height sensor LS is schematically shown in FIG. 4B, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may comprise an embodiment of the radiation source described herein. The beam BE1 from projection grating PGR is provided to the substrate W at angle ANG. The redirected radiation from the substrate W forms a beam BE2. Beam BE2 is incident on detection grating DGR. Radiation from detection grating DGR is detected by detector DET to provide a signal representative of the height of the substrate W.

The present disclosure is directed towards control of gas density in an optical fiber to achieve a desirable output spectrum. The density of the gas in the optical fiber can determine the output spectrum of the radiation source.

Figure 5:
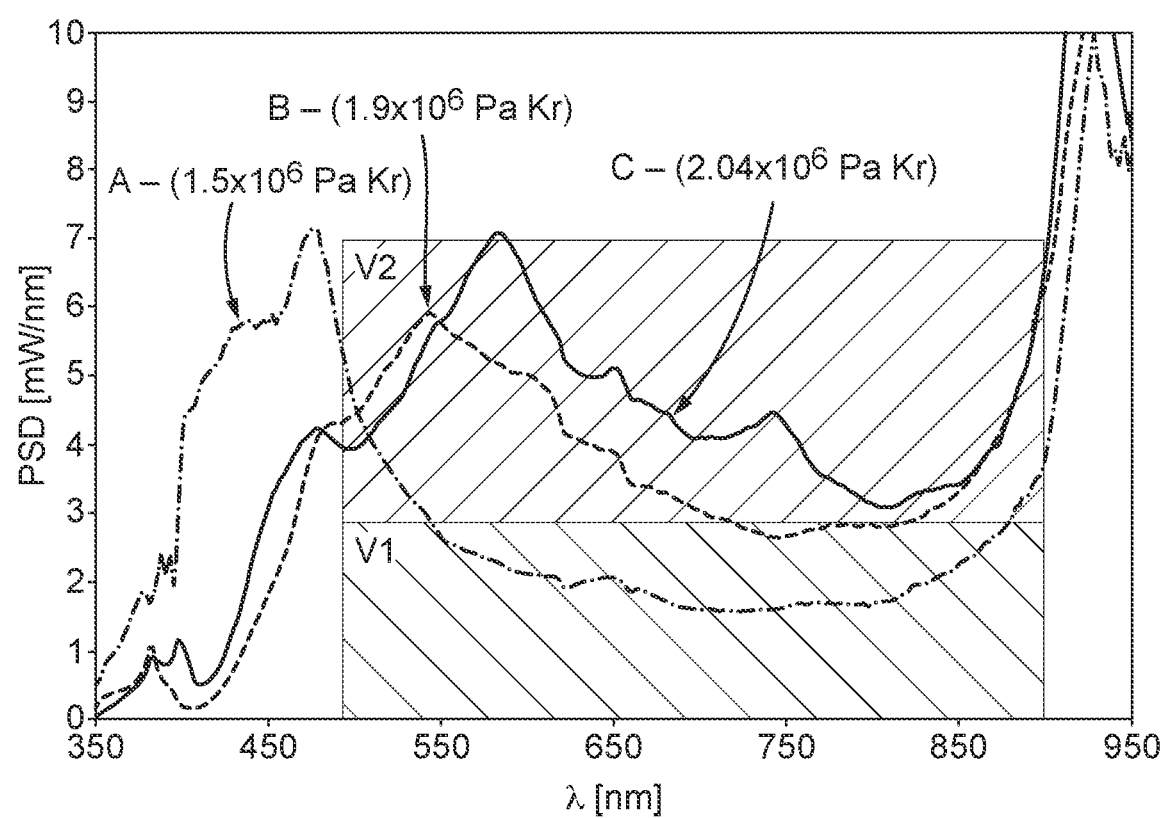
FIG. 5 depicts experimental results of output spectra resulting from variable gas pressure in a photonic crystal fiber (PCF)

FIG. 5 shows a power spectral density (PSD) of the output of a gas-filled photonic crystal fiber (PCF), as a function of the gas pressure inside the PCF. The core diameter of the PCF was 33 μm and the PCF length was 0.42 m. The PCF was filled with elemental krypton.

As shown in FIG. 5, the local maxima of the PSD shifts based on the pressure of the gas in the PCF. A gas pressure of $1.5 \times 10^6$ Pa Kr results in a "blue-optimized" output spectrum with a local maximum in the PSD at around 475 nm, shown by spectrum A. A gas pressure of $1.9 \times 10^6$ Pa Kr results in a "cyan-optimized" output spectrum with a local maximum in the PSD at around 550 nm, shown by spectrum B. A gas pressure of $2.04 \times 10^6$ Pa Kr results in a "green-optimized" output spectrum with a local maximum in the PSD at around 580 nm, shown by spectrum C.

While FIG. 5 discloses control of one or more spectral properties based on gas pressure inside a PCF, control of one or more spectral properties can also be performed based on some other property of the gas. In particular, control of one or more spectral properties may be achieved through control of gas density inside a PCF.

The present disclosure provides an apparatus and method for controlling the gas density in a gas-filled optical fiber, wherein the gas is not in fluid communication with an external source.

One or more external gas source is commonly used to control the gas pressure in a fixed-volume cell. The one or more external gas sources may use an external pressure regulator, and an outlet to an external sink, to control the density of gas in the gas cell at a given time. Such an external gas source could therefore be conceivably used to alter the density of gas in an optical fiber.

However, the use of an external gas source may introduce one or more problems. The use of an external gas source requires that this gas source be replaced or replenished when it is depleted. This gives rise to logistical complications, such as disconnecting the gas supply and refilling it, that may limit the manufacturing output of a lithography tool. It may also be generally undesirable to include a pressurized gas source in a lithography apparatus or metrology equipment, due to safety concerns. Including a highly pressurized gas source in the apparatus introduces an explosion risk.

In addition, controlling the density of the gas in an optical fiber by controlling the hydrostatic pressure of the gas with an external gas source results in a uniform distribution of gas density along the fiber. It may be desirable to make the density of the gas non-uniform along the fiber. Non-uniform gas density in an optical fiber can be used to provide desired output spectra. The output spectra may be desirable for metrology applications in particular.

A desirable output spectra may generally be that which has a flattened or equalized PSD across a particular range of wavelengths. A desirable output spectra may increase conversion efficiency from an optical source to the output. A desirable output spectra may have one or more other properties consistent with a supercontinuum. A desirable output spectra may comprise a PSD greater than 3 mW/nm in the 500 nm to 900 nm range, desirably a PSD greater than 6 mW/nm in the 400 nm to 1600 nm range, desirably a PSD greater than 10 mW/nm in the 200 nm to 2000 nm range.

The present disclosure provides a controllable radiation source, in particular, a radiation source with an output spectrum that can be controlled, varied, or stabilized. Control of the output spectrum is performed via local control of the gas density in the optical fiber, according to the embodiments of the invention.

In an embodiment, the radiation source of an embodiment comprises an optical fiber that is hollow, and has an axial direction; a gas that fills the hollow of the optical fiber; and a plurality of temperature setting devices disposed at respective positions along the axial direction of the optical fiber, wherein the temperature setting devices are configured to control the temperature of the gas to locally control the density of the gas.

In an embodiment, the optical fiber is a photonic crystal fiber.

In an embodiment, one or more of the temperature setting devices supply heat. In an embodiment, one or more of the temperature setting devices supply cooling, or are a heat sink. In an embodiment, the plurality of temperature setting devices comprise a combination of both heat-supplying and heat-removing devices.

In an embodiment, the one or more temperature setting devices are chosen from: one or more resistive heating elements, one or more dielectric heating elements, one or more Peltier elements, one or more fan coolers, and/or one or more liquid coolers.

In an embodiment, one or more of the temperature setting devices are disposed externally to the optical fiber. In an embodiment, one or more of the external temperature setting devices indirectly supply heat to the gas in the optical fiber by supplying heat to the fiber itself. Conversely, in an embodiment, one or more of the external temperature setting devices directly supply heat to the gas in the optical fiber without directly applying heat to the optical fiber itself, for example, via an alternating electric field or electromagnetic field.

In an embodiment, the temperature setting devices are configured to receive signals from a controller. In an embodiment, the controller is configured to control at each of the positions: the local temperature of the gas to a target temperature, or the heat flux supplied to the gas to a target heat flux.

In an embodiment, the target heat flux supplied to the gas at one or more positions is positive. In an embodiment, the target heat flux supplied to the gas at one or more positions is negative. In other words, the target heat flux may cause the supply or the removal of heat from the gas at one or more positions.

In an embodiment, the radiation source comprises a sensor configured to take a property measurement of the output of the radiation source, wherein the target temperature or target heat flux is based on this property measurement.

In an embodiment, the property measurement comprises one or more selected from: spectrum width, PSD, peak-PSD, spectral stability, and/or spectral slope.

In an embodiment, the radiation source comprises at least one temperature sensor configured to take a temperature measurement of the gas, wherein the target temperature or target heat flux is based on this temperature measurement.

In an embodiment, the radiation source comprises a plurality of temperature sensors. In an embodiment, these sensors are disposed at respective positions along the axial direction of the optical fiber. In an embodiment, the controller takes a measurement from each of the plurality of sensors. In an embodiment, the controller makes a control decision for the target temperature or target heat flux at each of the respective temperature setting device locations, based on a plurality of measurements.

In an embodiment, the radiation source comprises a support provided between the optical fiber and at least one of the temperature setting devices and configured to provide thermal contact between the optical fiber and the at least one temperature setting device.

In an embodiment, the support is composed of one of the materials selected from: aluminum, stainless steel, copper, gold, a metal, an alloy, silicon, or a semiconductor.

In an embodiment, the support section is between 1 mm to 10 cm thick.

In an embodiment, the support comprises a plurality of support sections arranged in the axial direction. In an embodiment, the support sections is configured such that the optical fiber is contacted by the support for most of the axial length of the optical fiber. In an embodiment, the support sections are configured such that they contact only a fraction of the optical fiber's axial length.

In an embodiment, the support sections are thermally isolated from each other. In other words, a first and second support section are thermally isolated such that: the first support section configured to communicate a first set temperature from a first temperature setting device does not thermally communicate with the second support section configured to communicate a second set temperature from a second temperature setting device. The set temperatures of the first and second temperature setting devices do not interfere with each other.

In an embodiment, the support sections are separated by a thermal gap.

In an embodiment, each of the support sections is composed of a different material. A support section may be composed of one of the materials selected from: aluminum, stainless steel, copper, gold, a metal, an alloy, silicon, or a semiconductor.

In an embodiment, the material of the support sections is chosen based on thermal conductivity.

In an embodiment, the support sections are configured such that the thermal conductivity of the support, or a section of the support, varies in the axial direction. In an embodiment, the support sections are configured such that the thermal conductivity of the support, or a section of the support, varies in a gradual gradient-like manner. Configuration of the support sections may include selection of materials and/or the geometry of the support.

In an embodiment, the position of the temperature setting devices in the axial direction are configured such that at least three neighboring devices are substantially equidistant from each other. In other words, the center-to-center distance of the temperature setting devices may be substantially equal for at least a group of the temperature setting devices. In an embodiment, the position of the temperature setting devices in the axial direction are configured such that at least three neighboring devices are substantially non-equidistant from each other. There may be a mixture of equidistant and non-equidistant spacing between the temperature setting devices.

In an embodiment, the radiation source is coupled to an optical source. In an embodiment, the optical source comprises: a femto-second infrared pump-pulse, a femto-second visible pump pulse, a pico-second infrared pump pulse, or a pico-second visible pump pulse.

In an embodiment, the gas of the radiation source comprises a noble gas. The gas of the radiation source may comprise: helium, neon, argon, krypton, xenon, hydrogen, oxygen, nitrogen, a noble gas or a molecular gas.

In an embodiment, the radiation source is used in a metrology device. The metrology device may include a stage for holding the substrate, and the radiation source may be so configured to project radiation onto a substrate held on the stage.

Figure 6:
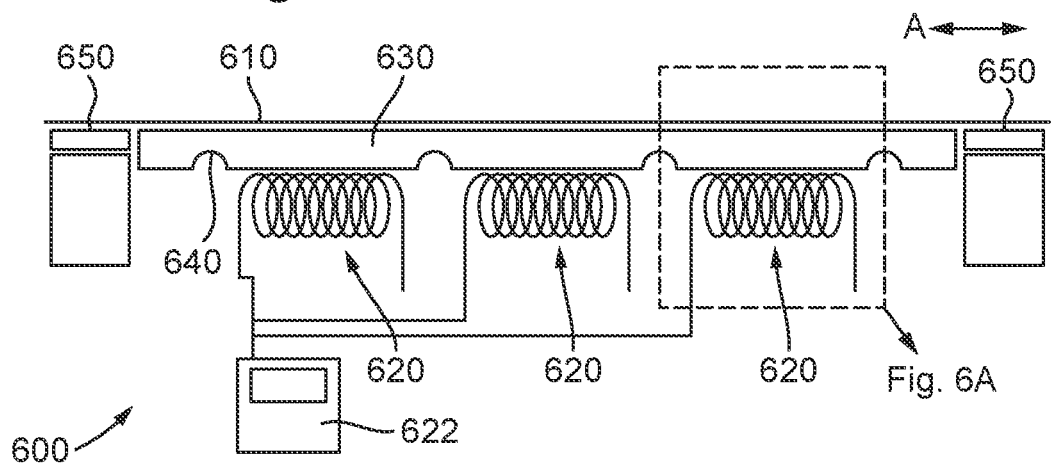
FIGS. 6 and 6A depict embodiments of a radiation source.

FIG. 6 shows a configuration of the radiation source 600 according to an embodiment. Optical fiber 610 is disposed on support 630 and v-groove blocks 650. A plurality of temperature setting devices 620 are disposed at respective positions along the axial direction A of the optical fiber. In an embodiment, the plurality of temperature setting devices are heating devices, cooling devices, or a combination of both. A support 630 is provided between the plurality of temperature setting devices and the optical fiber 610. The support 630 is so provided to improve the thermal communication between the temperature setting devices and positions on the optical fiber 610.

Figure 6A:
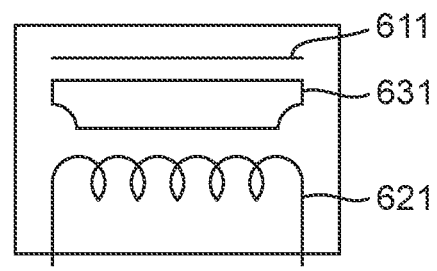

Thermal gaps 640 divide the support 630 into support sections. FIG. 6A shows a single support section 631, with the segment of the optical fiber 611 and the temperature setting device 621 that this particular support section is configured to communicate with. Support section 631 is configured so as to couple the output of temperature setting device 621 with the segment of the optical fiber indicated by 611. The thermal gaps 640 substantially prevent or limit thermal communication between each of the support sections. As such, a temperature setting device can be configured to control the temperature of the gas in the optical fiber substantially locally, over a given segment of the optical fiber corresponding to the length of the corresponding support section.

Even in the absence of a substantially thermally conductive support 630, local control of the gas at the respective axial positions by the temperature setting devices is still possible. The support may be omitted.

The embodiment of FIG. 6 may also comprise a controller 622, configured to send signals to the plurality of temperature setting devices 620.

The embodiment of FIG. 6 may also comprise an optical sensor for measuring a property of the output radiation of the radiation source 600 (not shown). The embodiment of FIG. 6 may also comprise one or more temperature sensors, optionally disposed at respective positions along the axial direction of the optical fiber. These sensors may be configured to send signals to the controller 622.

The controller 622 may be further configured to make control decisions based on the signals received from these sensors. Control decisions may include setting a target temperature or target heat flux for each of the temperature setting devices, and/or setting the output temperature of each of the temperature setting devices, optionally in response to these targets.

An optical sensor (not shown) may be disposed at the output of the radiation source 600, and configured to measure the output of the radiation source.

Optical sensors may be disposed at locations other than the output of the radiation source 600 to measure one or more other optical properties of the system. One or more optical sensors may be placed at axial positions on the optical fiber. The optical sensors may be configured to detect scattered radiation. The optical sensors may be configured to detect the axial location on the fiber at which the input radiation to the fiber is converted into super continuum radiation.

An embodiment of a method for operating a radiation source comprises controlling the temperature of the gas at a plurality of positions along the axial direction of the optical fiber, such that the density of the gas is locally controlled at each position.

In an embodiment, the method further comprises controlling the temperature of the gas at each of the positions to a target temperature, or controlling the heat flux supplied to the gas at each of the positions to a target heat flux.

In an embodiment, the target heat flux supplied to the gas at one or more positions is positive. In an embodiment, the target heat flux supplied to the gas at one or more positions is negative. In other words, the target heat flux may cause the supply or the removal of heat from the gas at one or more positions.

In an embodiment, the method further comprises determining a target temperature or target heat flux based on a measurement of the output of the radiation source, or the local temperature of the gas at one or more locations.

In an embodiment, the measurement of the output of the radiation source is a property measurement of the output radiation. The property measurement may comprise one or more selected from: spectrum width, PSD, peak-PSD, spectral stability, and/or spectral slope.

The controller 622 may take a plurality of property measurements or temperature measurements over time, storing these historical measurements in a storage unit. The controller 622 may take property or temperature measurements at given time intervals. The controller 622 may use a plurality of historical measurements to determine the target temperature or target heat flux of each of the temperature setting devices.

In an embodiment, the method further comprises the controller 622 implementing a target temperature or a target heat flux for each of the positions such that the gas has a non-uniform density in the axial direction.

The radiation source 600 may generate unwanted heat while operating. In particular, the optical source can cause heating of the optical fiber, or heating of the gas in the optical fiber at particular locations. One or more temperature sensors, one or more optical sensors, or one or more other sensor types may be configured to detect these unwanted heating effects. The controller 622 may be configured to receive signals from these one or more sensors, and in response, the controller 622 may provide signals to one or more temperature setting devices to compensate for these unwanted heating effects.

Figure 7:
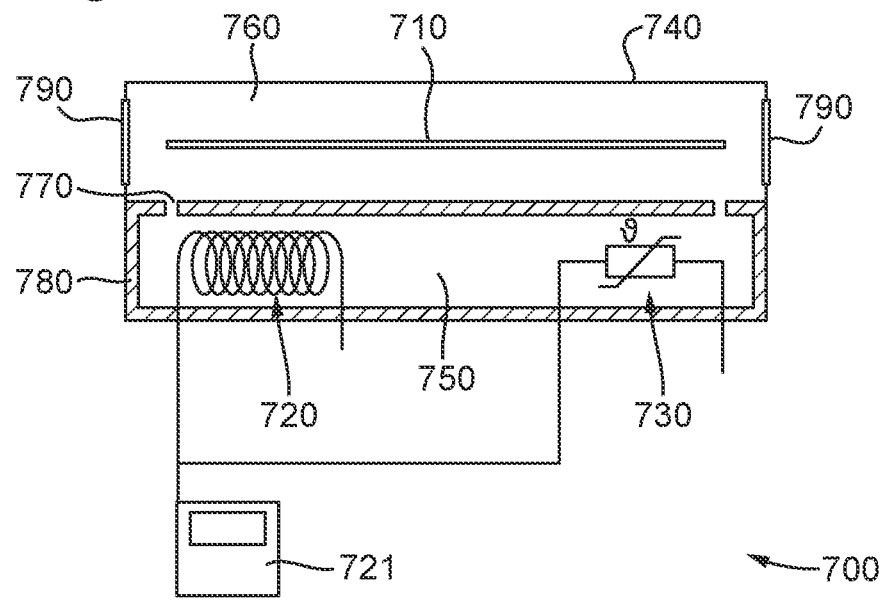
FIG. 7 depicts a further arrangement of a radiation source.

FIG. 7 provides a further embodiment. Radiation source 700 comprises a gas-filled optical fiber 710 embedded in a gas cell 740. Gas cell 740 further comprises a control compartment 750 and a fiber compartment 760. The optical fiber is embedded in the fiber compartment, and may be optically coupled to windows 790. Windows 790 may be disposed at either end of the fiber compartment 760. The windows are configured to optically couple the optical fiber 710 with any external elements.

The control compartment 750 and fiber compartment 760 are in fluid communication with each other via an orifice 770. The control compartment may further comprise insulation 780. A temperature setting device 720 is disposed in the control compartment 750 and is configured to control the temperature of the gas therein. Radiation source 700 may also comprise a temperature sensor 730, disposed in the control compartment 750.

In this embodiment, control of the gas in the optical fiber is actuated by the temperature setting device 720 in the control compartment 750. As the gas cell 740 has a constant volume, when the temperature setting device heats or cools the gas in the control compartment 750, the local change of pressure is communicated via orifice 770 to the fiber compartment 760. The density of the gas in fiber compartment 760 will inversely increase or decrease relative to the gas density change in the control compartment 750, also increasing or decreasing the gas contained in the optical fiber 710.

In an embodiment, the radiation source 700 is coupled to an optical source. In an embodiment, the optical source comprises: a femto-second infrared pump-pulse, a femto-second visible pump pulse, a pico-second infrared pump pulse, or a pico-second visible pump pulse.

In an embodiment, the gas of the radiation source 700, optionally the gas of the gas cell 740, comprises a noble gas. The gas may comprise: helium, neon, argon, krypton, xenon, hydrogen, oxygen, nitrogen, a noble gas or a molecular gas.

In an embodiment, the volume of the control compartment 750 is at least comparable to the volume of the fiber compartment 760. If the volume of the control compartment is larger, the required output temperature range of the temperature setting device 720 to achieve a desired density range in the optical fiber 710 is reduced.

The relative sizes of the control compartment 750 and the fiber compartment 760 may be configured such that the temperature setting device 720 has a required output temperature range of ±10% or less, desirably ±5% or less, the absolute temperature of the gas cell 740 to achieve the desired gas density range in the optical fiber.

The size of the orifice 770 can be configured such that significant thermal exchange between the control compartment 750 and the fiber compartment 760 is prevented, while also ensuring that enough pressure is equalized within a desired target response time. These two requirements provide a minimum and maximum desirable orifice size respectively.

In an embodiment, the temperature setting device 720, insulation 780 and electrical connections made in the gas cell 740 are formed of materials that do not out-gas and are compatible with the chosen working gas of the gas cell 740.

In an embodiment, the control compartment 750 is integrated with the gas cell 740 as shown in FIG. 7, or it may be external to gas cell 740 and communicate with the gas cell and fiber compartment 760 via an orifice or tube.

In the arrangement of the gas cell 740 with an integrated control compartment 750, the control compartment may comprise insulation 780. Insulation 780 may be thermal insulation. Insulation 780 may be a lining covering a substantial portion of the interior of the control compartment 750. The insulation 780 may be so configured to prevent a change in temperature of the gas in the control compartment 750 from structurally warping the gas cell 740. Such structural warping of the gas cell 740 could introduce errors to the optical coupling between the optical fiber 710 and external elements provided by the windows 790.

In an embodiment, the temperature setting device 720 and the temperature sensor 730 are configured to be in communication with a controller 721. Controller 721 may provide a signal to temperature setting device 720 based on a measurement received from the temperature sensor 730.

Optionally, one or more other sensors may be in communication with the controller 721. The one or more possible additional sensors can include, but are not limited to: one or more temperature sensors, one or more optical sensors and/or one or more flow sensors.

An optical sensor may be in communication with the controller 721. The optical sensor may be configured to measure the output radiation of the radiation source 700. The measurement of the output radiation source may comprise one or more selected from: spectrum width, PSD, peak-PSD, spectral stability, and/or spectral slope.

In an embodiment, a flow sensor is in communication with the controller 721. The flow sensor may be configured to measure the gas flow through orifice 770.

In an embodiment, the controller 721 receives signals from one or more sensors, and is configured to set a target temperature for the control compartment in response to one or more of the received signals.

In an embodiment, the controller 721 is configured to set an output temperature for the temperature setting device in response to signals received from the one or more sensors, or in response to a determined or pre-programmed target temperature.

Embodiments are provided according to the following clauses:

1. A radiation source, comprising:
   an optical fiber that is hollow, and has an axial direction;
   a gas that fills the hollow of the optical fiber; and
   a plurality of temperature setting devices disposed at respective positions along the axial direction of the optical fiber,
   wherein the temperature setting devices are configured to control the temperature of the gas to locally control the density of the gas.
2. The radiation source of clause 1, further comprising a controller configured to control at each of the positions: the local temperature of the gas to a target temperature, or the heat flux supplied to the gas to a target heat flux.
3. The radiation source of clause 2, further comprising a sensor configured to take a property measurement of the output of the radiation source, wherein the target temperature or target heat flux is based on this property measurement.
4. The radiation source of clause 2, further comprising at least one temperature sensor configured to take a temperature measurement of the gas, wherein the target temperature or target heat flux is based on this temperature measurement.
5. The radiation source of any of clauses 1-4, further comprising a support provided between the optical fiber and at least one of the temperature setting devices and configured to provide thermal contact between the optical fiber and the at least one temperature setting device.
6. The radiation source of clause 5, wherein the support comprises a plurality of support sections arranged in the axial direction and thermally isolated from each other.
7. The radiation source of clause 6, wherein the support sections are separated by a thermal gap.
8. The radiation source of any of clauses 1-7, wherein at least two of the intervals between each of the temperature setting devices in the axial direction are substantially equal.
9. The radiation source of any of clauses 1-8, wherein the gas comprises a noble gas.
10. A metrology device, comprising
    a stage configured to hold a substrate, and
    the radiation source of any of clauses 1-9 for projecting radiation onto the stage.
11. A method for operating a radiation source comprising a gas-filled optical fiber, the method comprising:
    controlling the temperature of the gas at a plurality of positions along the axial direction of the optical fiber, such that the density of the gas is locally controlled at each position.
12. The method of clause 11, further comprising controlling the temperature of the gas at each of the positions to a target temperature, or controlling the heat flux supplied to the gas at each of the positions to a target heat flux.
13. The method of clause 11 or clause 12, wherein a target temperature or target heat flux is determined based on a measurement of the output of the radiation source and/or on the local temperature of the gas at one or more locations.
14. The method of any of clauses 11-13, wherein the controlling implements a target temperature or a target heat flux for each of the positions such that the gas has a non-uniform density in the axial direction.
15. The method of any of clauses 11-14, further comprising using the generated radiation source in a metrological instrument.
16. A radiation source, comprising:
    an optical fiber that is hollow, and has an axial direction; and
    one or more temperature setting devices,
    wherein the one or more temperature setting devices are configured to control the temperature of a gas that fills the hollow of the optical fiber along the axial direction of the optical fiber to locally control the density of the gas.
17. The radiation source of clause 16, further comprising a controller configured to control at each of a plurality of positions along the axial direction: the local temperature of the gas to a target temperature, and/or the heat flux supplied to the gas to a target heat flux.
18. The radiation source of clause 17, further comprising a sensor configured to take a property measurement of the output of the radiation source, wherein the target temperature or target heat flux is based on this property measurement or at least one temperature sensor configured to take a temperature measurement of the gas, wherein the target temperature or target heat flux is based on this temperature measurement.

19. The radiation source of clause 16, further comprising a support provided between the optical fiber and at least one of the temperature setting devices and configured to provide thermal contact between the optical fiber and the at least one temperature setting device.

20. A metrology device, comprising
a stage configured to hold a substrate, and
the radiation source of clause 16 for projecting radiation onto the stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

While specific embodiments of the invention have been described above, it will be appreciated that the invention may be practiced otherwise than as described.

The descriptions above are intended to be illustrative, not limiting. Thus it will be apparent to one skilled in the art that modifications may be made to the invention as described without departing from the scope of the claims set out below.

The invention claimed is:

1. A radiation source, comprising:
an optical fiber that is hollow, and has an axial direction; and
one or more temperature setting devices,
wherein the one or more temperature devices are configured to control a temperature of a gas so as to control the density of gas that fills the hollow of the optical fiber.

2. The radiation source of claim 1, wherein the optical fiber is located in a first chamber and the one or more temperature setting devices are configured to control the temperature of gas in a second chamber, the second chamber fluidly connected to the first chamber.

3. The radiation source of claim 2, wherein the first chamber is thermally insulated from the second chamber.

4. The radiation source of claim 1, further comprising:
a sensor configured to measure flow through an orifice fluidly connecting the first and second chambers; and
a controller configured to control, based on an output of the sensor, the one or more temperature setting devices.

5. The radiation source of claim 1, further comprising:
a sensor configured to take a property measurement of the output of the radiation source; and
a controller configured to control, based on an output of the sensor, the one or more temperature setting devices.

6. The radiation source of claim 1, further comprising:
a temperature sensor configured to take a temperature measurement of the gas controlled by the one or more temperature devices; and
a controller configured to control, based on an output of the sensor, the one or more temperature setting devices.

7. The radiation source of claim 1, wherein the gas comprises a noble gas.

8. A metrology device, comprising:
a stage configured to hold a substrate, and
the radiation source of claim 1 for projecting radiation onto the stage.

9. A radiation source, comprising:
an optical fiber that is hollow, and has an axial direction, the optical fiber located in a first chamber; and
one or more temperature setting devices, the one or more temperature setting devices configured to change a pressure of gas in a second chamber,
wherein the change of pressure is communicated to the first chamber via a fluid connection between the first and second chambers.

10. The radiation source of claim 9, wherein the first chamber is thermally insulated from the second chamber.

11. The radiation source of claim 9, further comprising:
a sensor configured to take a property measurement of the output of the radiation source; and
a controller configured to control, based on an output of the sensor, the one or more temperature setting devices.

12. The radiation source of claim 9, further comprising:
a temperature sensor configured to take a temperature measurement of the gas in the second chamber; and
a controller configured to control, based on an output of the sensor, the one or more temperature setting devices.

13. The radiation source of claim 9, further comprising:
a sensor configured to measure flow through an orifice fluidly connecting the first and second chambers; and
a controller configured to control, based on an output of the sensor, the one or more temperature setting devices.

14. The radiation source of claim 9, wherein the gas comprises a noble gas.

15. A metrology device, comprising:
a stage configured to hold a substrate, and
the radiation source of claim 9 for projecting radiation onto the stage.

16. A radiation source, comprising:
an optical fiber that is hollow, and has an axial direction; and
one or more temperature setting devices configured to change a pressure of gas,
wherein the change of pressure is applied to gas that fills the hollow of the optical fiber.

17. The radiation source of claim 16, wherein the optical fiber is located in a first chamber and the one or more temperature setting devices are configured to control the temperature of gas in a second chamber, the second chamber fluidly connected to the first chamber.

18. The radiation source of claim 17, wherein the first chamber is thermally insulated from the second chamber.

19. The radiation source of claim 16, further comprising:
a sensor configured to take a property measurement of the output of the radiation source; and
a controller configured to control, based on an output of the sensor, the one or more temperature setting devices.

20. A metrology device, comprising:
a stage configured to hold a substrate, and the radiation source of claim 16 for projecting radiation onto the stage.

\* \* \* \* \*